United States Patent [19]
Boettcher

[11] Patent Number: 5,828,215
[45] Date of Patent: Oct. 27, 1998

[54] METHOD FOR PHASE CONTRAST MR ANGIOGRAPHY, AND ARRANGEMENT FOR CARRYING OUT THE METHOD

[75] Inventor: Uwe Boettcher, Erlangen, Germany

[73] Assignee: Siemens Aktiengesellschaft, Munich, Germany

[21] Appl. No.: 694,474

[22] Filed: Aug. 7, 1996

[30] Foreign Application Priority Data

Aug. 10, 1995 [DE] Germany ................... 195 29 512.9

[51] Int. Cl.⁶ ................................................. G01V 3/00
[52] U.S. Cl. ........................................ 324/306; 324/307
[58] Field of Search ............................ 324/300, 306, 324/307, 309, 318; 128/653.2, 653.5; 600/410, 413

[56] References Cited

U.S. PATENT DOCUMENTS

| | | |
|---|---|---|
| Re. 32,701 | 6/1988 | Moran . |
| 4,752,734 | 6/1988 | Wedeen ........................... 324/306 |
| 4,800,889 | 1/1989 | Dumoulin et al. ............... 128/653 |
| 4,918,386 | 4/1990 | Dumoulin et al. ............... 324/309 |
| 5,038,783 | 8/1991 | Dumoulin ........................ 128/653 |
| 5,101,156 | 3/1992 | Pelc ................................. 324/306 |
| 5,133,357 | 7/1992 | Dumoulin et al. ............... 600/413 |

FOREIGN PATENT DOCUMENTS

| | | |
|---|---|---|
| 0 142 343 | 11/1984 | European Pat. Off. . |
| 0 492 898 | 7/1992 | European Pat. Off. . |

OTHER PUBLICATIONS

"Three–dimensional Time–of–Flight MR Angiography: Applications in the Abdomen and Thorax," Lewin et al., Radiology, vol. 179 (1991), pp. 261–264.

Primary Examiner—Louis M. Arana
Attorney, Agent, or Firm—Hill & Simpson

[57] ABSTRACT

In a method and apparatus for phase contrast MR angiography, for topically resolved flow acquisition, bipolar flow coding gradients are activated before readout of nuclear magnetic resonance signals. By using flow coding gradients of different amplitudes in successive measurements within a pulse sequence, nuclear magnetic resonance signals are obtained that are differently sensitive to flow. A larger range of flow velocities can thereby be covered.

14 Claims, 3 Drawing Sheets

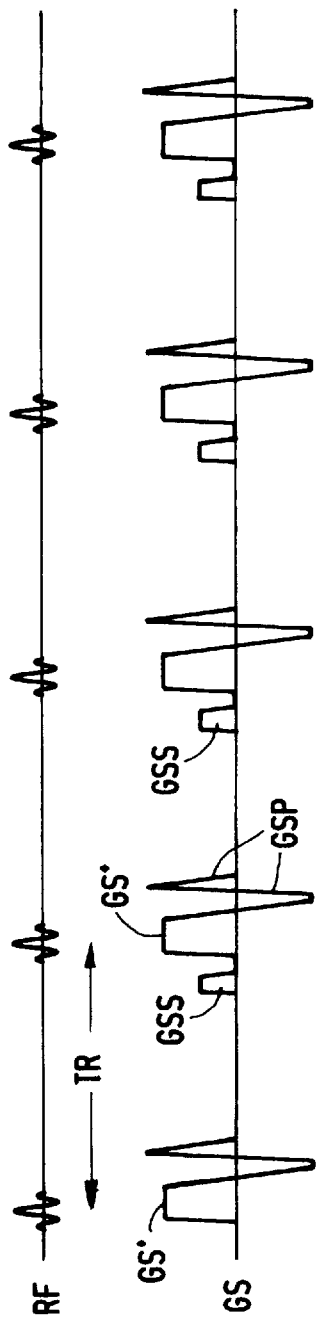
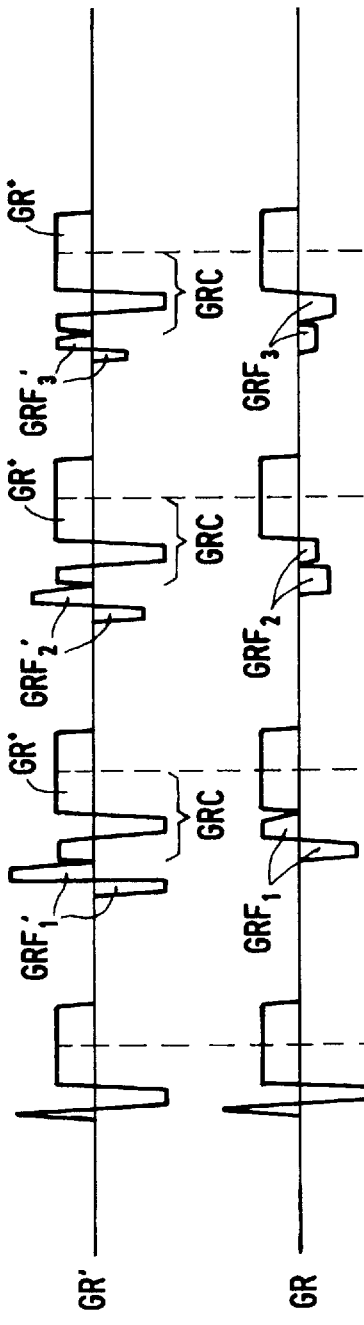
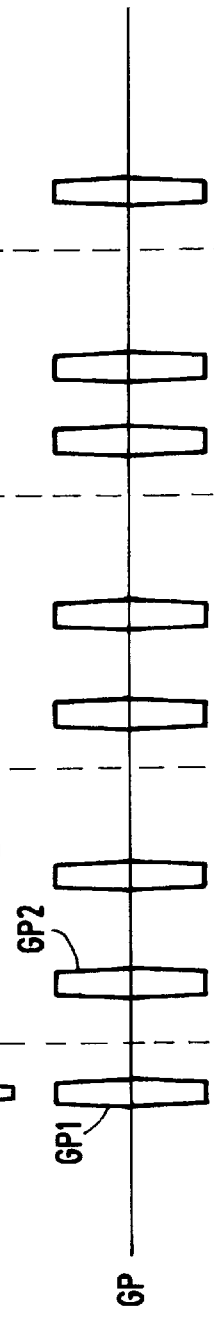
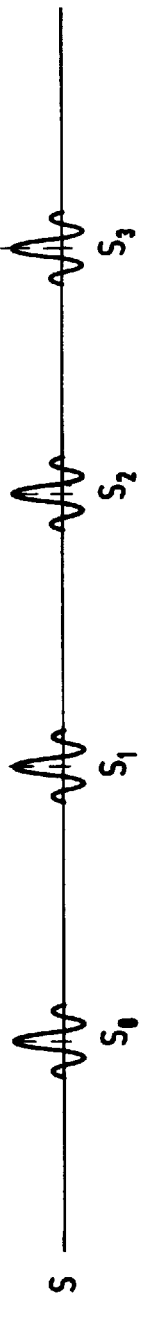

METHOD FOR PHASE CONTRAST MR ANGIOGRAPHY, AND ARRANGEMENT FOR CARRYING OUT THE METHOD

BACKGROUND OF THE INVENTION

1. Field of the Invention

The present invention is directed to a method for conducting phase contrast magnetic resonance angiography, as well as to an apparatus for conducting the method.

2. Description of the Prior Art

For the production of flow images by means of nuclear magnetic resonance, two methods are fundamentally possible, namely the "time of flight" method and the phase contrast method. The first method, which is described e.g. by J. S. Lewin et al., "Three-Dimensional Time of Flight MR-Angiography: Applications in the Abdomen and Thorax," Radiology, 1991; 179, pp. 261–264, is based on the fact that stationary tissue in a region under examination becomes saturated, and that the signal thus arises almost exclusively from unsaturated spins flowing in to that region.

The phase contrast method is known e.g. from U.S. Pat. No. Re. 32,701. In this method, it is exploited that spins moving in the direction of field gradients experience a phase displacement of the transversal magnetization that corresponds directly to the velocity of flowing spins. The flow can thus be acquired through the determination of the phase of the measured nuclear magnetic resonance signals. For the phase encoding, symmetrical, bipolar gradient pulses are used that have a gradient time integral of zero, so that the phase of stationary spins is not influenced, i.e., $$\int_0^t G(t')dt' = 0$$

The phase displacement $\Phi(t)$ of the transversal magnetization of spins at position $x(t)$ is given by:

$$\phi(t) = \gamma \int_0^t Gx(t')x(t')dt'$$

wherein $\gamma$ is the gyromagnetic ratio and $Gx(t)$ is the gradient amplitude in the x direction at time t. By representing the coordinate $x(t)$ in a Taylor series, the phase displacement can be divided into different components: $\Phi_{s(t)}$ is the phase displacement term for stationary spins, $\Phi_{v(t)}$ is the phase displacement term corresponding to a motion of the spins in the direction of the gradient G with constant velocity, and $\Phi_{a(t)}$ is the phase displacement term corresponding to a constant acceleration a of spins in the direction of the gradient Gx, i.e., $$\phi(t) = \phi_S(t) + \phi_v(t) + \phi_a(t) + \ldots,$$

$$\Phi_S(t) = \gamma \cdot x(0) \int_0^t Gx(t')dt',$$

$$\Phi_v(t) = \gamma \cdot v \int_0^t Gx(t') \cdot t' \cdot dt', \text{ and}$$

$$\phi_a(t) = \gamma \cdot a \cdot \int_0^t Gx(t') \cdot t'^2/2 dt'.$$

If a symmetrical bipolar gradient pulse is activated between the excitation and the readout of nuclear magnetic resonance signals, a velocity-dependent phase displacement at time TE of the nuclear magnetic resonance signal is obtained:

$$\Phi_v(t=TE)=\gamma.v.Gx\Delta\Sigma$$

wherein Gx is the gradient amplitude, $\Delta$ is the distance between the positive and negative sub-pulse, and $\Sigma$ is its duration. If no higher-order motion takes place, the phase displacement of the transversal magnetization at echo time TE is proportional to the flow velocity v. The phase displacement of stationary spins is not influenced by a symmetrical bipolar gradient pulse.

From European Application 0 142 343, it is further known to use such bipolar gradient pulses for the rephasing of moved spins, i.e. for flow compensation. In this case, the following holds for the gradient G(t):

$$\int_0^t G(t') \cdot t' \cdot dt' = 0.$$

If a reference measurement, in which a flow compensation is carried out, is performed in addition to the flow-sensitive measurement, then by comparison with the reference measurement, the phase, and thereby the flow, as well as possibly the quantified velocity thereof, can be determined.

In the phase contrast method, the region in which an unambiguous connection exists between the phase displacement and velocity is limited to a phase displacement range of 180°. This represents a limit for the maximum velocity that can still be acquired with the phase contrast method. Since the phase displacement is proportional both to the flow velocity and to the amplitude of the bipolar flow encoding gradient, the velocity limit depends on the amplitude of the bipolar flow encoding gradient. If the velocity region is chosen very large, small velocities are still not sufficiently represented. In practice, several measurements are thus required for different velocity ranges, if it is desired, for example, to represent both the main arteries with high flow velocities and also peripheral vessels with low flow velocities. The measurements ensue one after the other, with the result that the method becomes costly with respect to time. Moreover, due to possible movements of the patient under examination between two measurements at a substantial time interval, the possibility of spatially classifying both measurements is disturbed.

SUMMARY OF THE INVENTION

It is an object of the present invention to provide a method and apparatus for phase-contrast MR angiography wherein the above-discussed disadvantages are avoided.

The above object is achieved in a method and apparatus in accordance with the principles of the present invention wherein data for generating a spatially-resolved image of a flow, such as blood flow, are obtained by a pulse sequence which is repeated n times, the sequence including excitation of nuclear magnetic resonance signals in a subject by the emission of radio-frequency pulses, activating a phase encoding gradient in a first direction, activating a bipolar flow encoding gradient, having at least two sub-pulses, in at least one direction, reading out nuclear magnetic resonance signals under a readout gradient in a second direction perpendicular to the first direction, determining the flow in the subject by means of the phase of the read-out nuclear magnetic resonance signals, with the amplitude-time integral of the sub-pulses of the bipolar flow encoding gradient being different in successive measurements in the same pulse sequence, given the same phase encoding gradient, so that measurements having different flow encoding data are obtained.

In one embodiment, the amplitude of the bipolar flow encoding gradient is varied in successive measurements, but the duration thereof remains constant from measurement to measurement.

The data having different bipolar flow encoding gradients can be used to generate separate images of all vessels containing a flow of a similar velocity therein. For example, an image of vessels having relatively low flow velocity therein, generally representing peripheral vessels. A separate image can be generated from data representing vessels with a flow at a relatively high velocity therein, generally corresponding to main arteries. It is also possible to combine the data in a single image, showing both peripheral vessels and main arteries.

The flow encoding gradient can be emitted in the second direction, in which case a flow compensation gradient is then emitted in at least one direction as well. The sequence can be executed with different directions of the flow encoding gradient.

The sequence can be conducted with a repetition time which is shorter than the relaxation times T1 and T2 of the nuclear spins, with the phase encoding of the nuclear spins being reset before each new RF excitation.

DESCRIPTION OF THE DRAWINGS

FIGS. 2 to 7 show an exemplary embodiment of a pulse sequence according to the inventive method.

DESCRIPTION OF THE PREFERRED EMBODIMENTS

Figure 1:
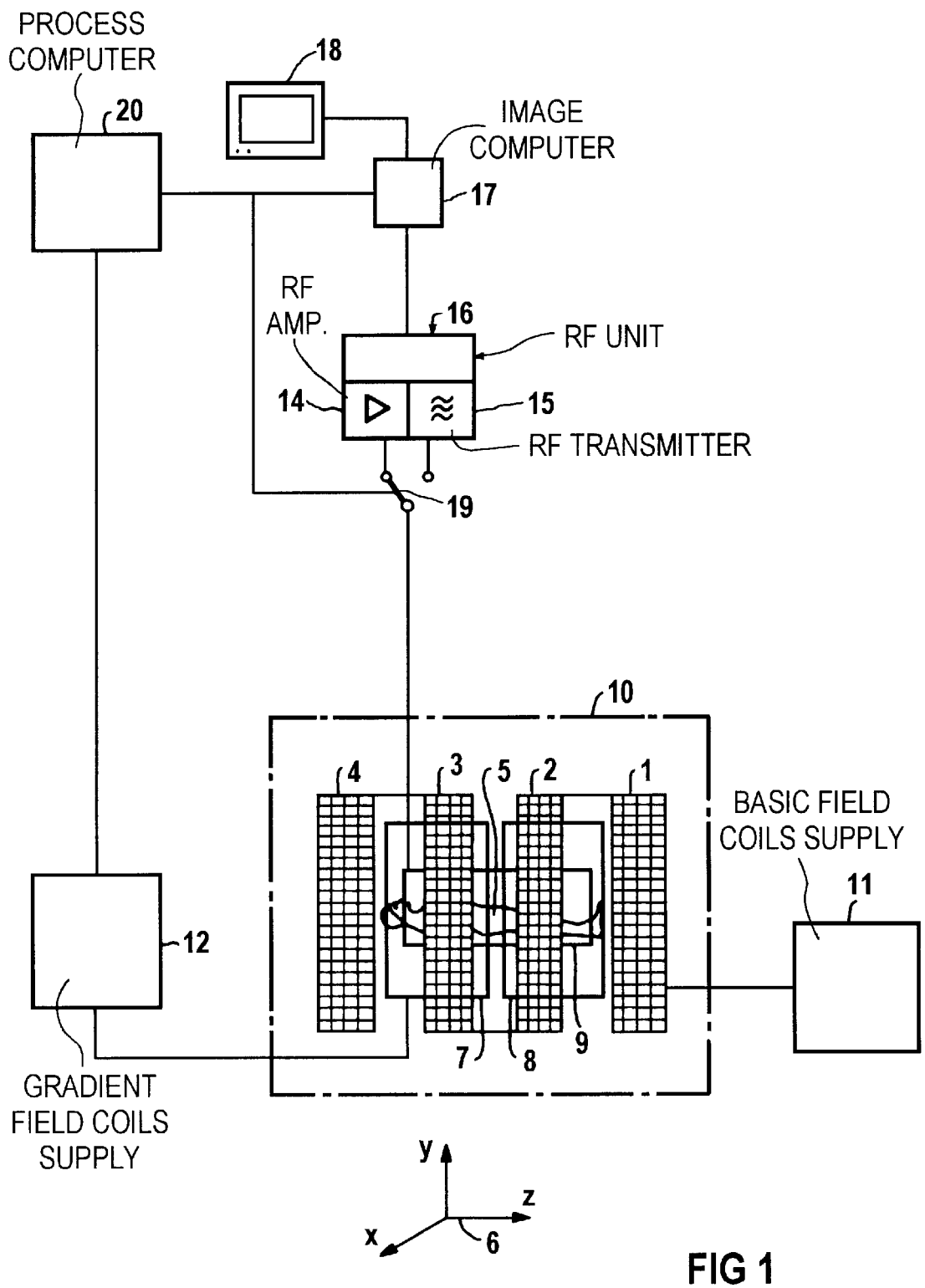
FIG. 1 is a schematic representation of the construction of a nuclear spin tomography apparatus, constructed and operating in accordance with the principles of the present invention.

FIG. 1 schematically shows the basic components of a nuclear spin tomography apparatus. Coils 1 to 4 which are supplied by a basic field coils supply 11, generate a basic magnetic field $B_0$. A patient 5 is located in this field during the examination. In addition, gradient coils are present that are provided for the generation of independent magnetic field components, perpendicular to one another, in the directions x, y and z, according to the coordinate system 6. For clarity, FIG. 1 shows only the gradient coils 7 and 8, which serve for the generation of an x gradient, together with a pair of gradient coils of the same type, lying opposite. The y-gradient coils (not shown), which are of the same type, lie parallel to the body 5, both above and below it, and those for the z-gradient field lie transverse to the longitudinal axis of the body 5 at the head end and the foot end. By means of these gradient coils, the gradients required for spatial resolution of the NMR signals are generated, and the gradients used for the flow coding are also generated. For this purpose, the gradient coils 7 and 8 and the additional gradient coils not shown are excited by a current according to a predetermined pulse pattern supplied by a gradient field coils supply 12.

For the excitation and the reception of nuclear magnetic resonance signals, a radio frequency antenna 9 is provided. This antenna is connected alternately, via a receiving amplifier 14 or via a radio frequency transmitter 15, with an image computer 17 to which a monitor 18 is connected. The receiving amplifier 14 and the radio frequency transmitter 15 form a radio frequency apparatus 16, whereby a changeover switch 19 enables switching between transmission or reception modes.

The pulse sequence for the gradient current amplifier 12 is predetermined by a process computer 20. This computer further controls the changeover switch 19 and the image computer 17.

FIGS. 2 to 7 show an exemplary embodiment for a pulse sequence for carrying out the inventive method. As shown in FIG. 2, radio frequency pulses RF are radiated onto a subject of examination with a repetition time TR that is shorter than the relaxation times T1 and T2 of the nuclear spins. During the radiation of the radio frequency pulses RF, a positive partial pulse $GS^+$ of a slice selection gradient GS is emitted, so that by means of the radio frequency pulses RF only one slice of the subject under examination is excited, which slice is predetermined by the frequency spectrum of the respective radio frequency pulse RF and the amplitude of the respectively effective slice selection gradient GS.

The pulse sequence shown is to be flow-sensitive in only one direction, namely in the direction of the readout gradient GR. In order to eliminate the undesired flow and motion sensitivity in the direction of the other gradients, bipolar gradient pulses GSP, which likewise lie in the direction of the slice selection gradient GS, follow upon each excitation. For these bipolar gradient pulses GSP, the following condition holds for the time interval between the excitation (t=0) and the time TE of the created nuclear magnetic resonance signal (echo signal) S:

$$\int_{t=0}^{TE} (GS^+(t') + GSP(t'))t' \cdot dt' = 0$$

A flow or a motion in the direction of the slice selection gradient GS thus has no effect on the phase position of the excited nuclear spin. The condition $$\int_{t=0}^{TE} (GS^+(t') + GSP(t'))dt' = 0$$

also holds. That is, stationary spins are not influenced by the bipolar gradient pulse GSP at the readout time.

Before each new excitation, a positive gradient pulse GSS is activated as a gradient spoiler. This serves for the destruction of any phase coherence of the nuclear magnetic resonance signals which may still be present after each measurement.

FIG. 4 shows the curve of a readout gradient GR', wherein for clarity the bipolar gradient pulses for the flow coding are shown separately.

According to FIG. 7, each signal S is read out with a positive sub-pulse $GR^+$ of the readout gradient. Furthermore, as in standard sequences, a pre-phasing in the negative direction is required. For the purpose of explanation (i.e. in order to represent the flow coding separately), in FIG. 4 a flow compensation is connected upstream from the readout gradient GR⁺. The pre-phasing and the flow compensation together are achieved by the gradient curve designated GRC in FIG. 4. This gradient curve GRC is composed of a bipolar pulse and the part of the readout gradient GR⁺ up to the respective echo time TE.

If only the curve designated GRC in FIG. 4 is regarded, a pulse sequence that is flow-compensated in the direction of the readout gradient GR' is present. With the exception of the first readout interval, however, a further bipolar gradient pulse $GRF_1'$, $GRF_2'$, $GRF_3'$ is prefixed to each further readout interval for the flow coding. For this flow coding gradient GRF', the following holds:

$$\int_0^{t=TE} GRF'(t)t'dt' \neq 0.$$

That is, as is explained in more detail above, a phase displacement dependent on flow velocity is generated. As can be seen in FIG. 4, the bipolar gradient pulses $GRF_1'$, $GRF_2'$, $GRF_3'$ for the flow encoding have a different amplitude for the three sequence measurements shown, so that the phases of the subsequent nuclear magnetic resonance signals are differently sensitive to flow.

The pulse sequence according to FIG. 4 is shown only for a more clear understanding of the basic idea of the invention. In practice, the four sub-pulses in this embodiment can be combined before the readout gradient GR⁺ into one bipolar gradient GRF, as shown in FIG. 5, whereby again the following conditions are satisfied:

$$\int_{t=0}^{TE} [GRF(t') + GR^+(t)]dt' = 0 \text{ and}$$

$$\int_{t=0}^{TE} [GRF(t') + GR^+(t) \cdot t' \cdot dt' \neq 0.$$

Corresponding to the different amplitudes of the bipolar gradients $GRF_1$, $GRF_2$, $GRF_3$, acting as flow encoding gradients, the individual signals S1 to S3 are flow-sensitive to different degrees. No flow encoding ensues upon the first signal S0. Rather, this signal is flow-compensated, i.e. largely independent of the flow, and is used as a reference signal.

By means of the slice selection gradient GS, a selection of a slice perpendicular to the direction of this slice selection gradient GS is carried out. By means of the readout gradient GR⁺, a frequency encoding further ensues in the direction of the readout gradient GR. Finally, a phase encoding ensues according to FIG. 6 by means of a phase coding gradient GP in the direction of this readout gradient GR. The phase displacement generated by a phase encoding gradient GP1 before obtaining the signal is reset after obtaining the signal by means of a gradient GP2. In conventional pulse sequences, the phase encoding gradient GP is advanced respectively from one signal to the next. If, however, it is desired (as in the present case) to obtain a flow-compensated signal S0 and three differently flow-sensitive signals S1 to S3, it is useful to conduct the phase encoding for the signals S0 to S3 uniformly, and to advance the phase coding gradient GP only for obtaining the next group of signals.

Figure 8:
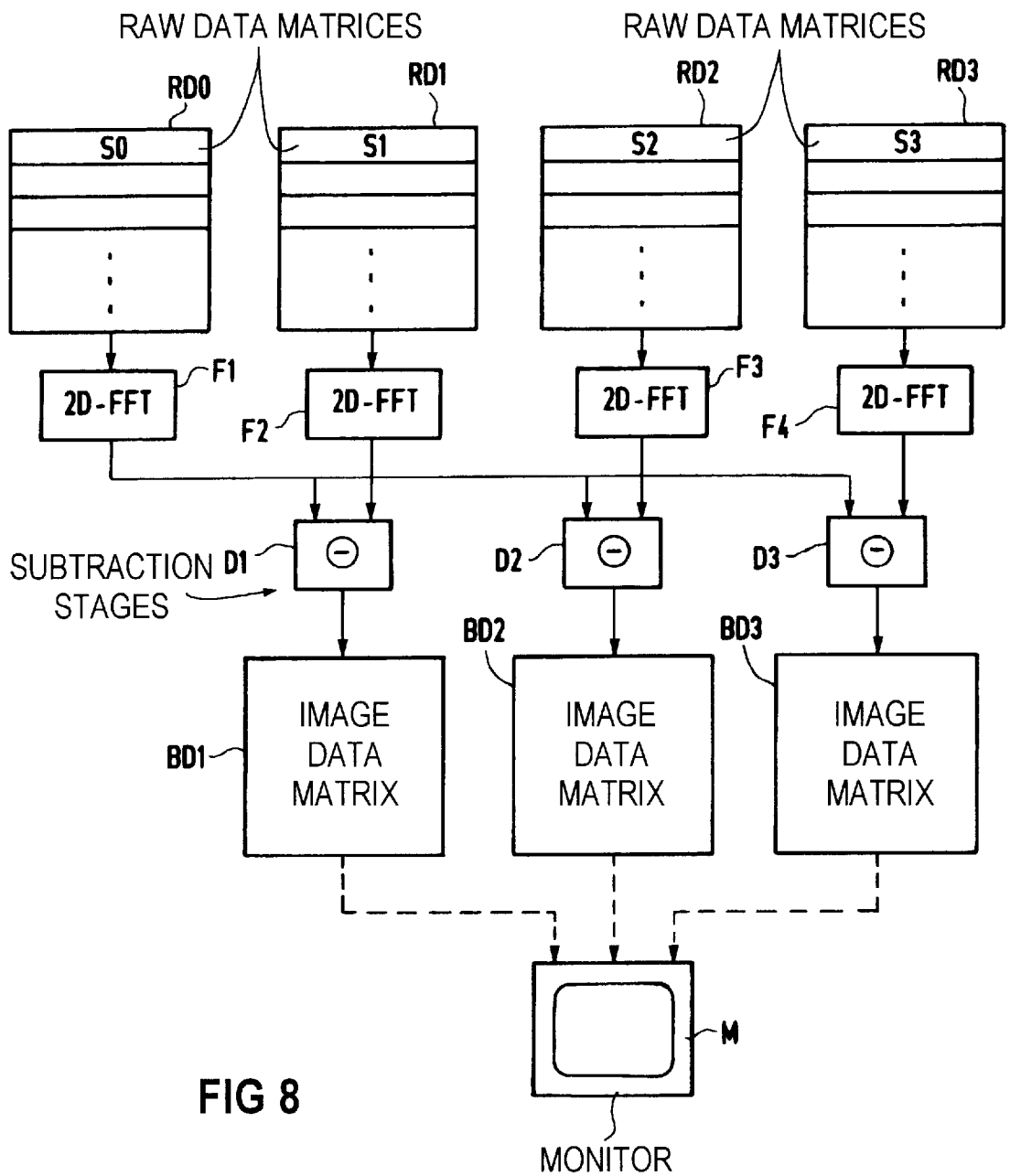
FIG. 8 is a schematic representation of the processing of the obtained nuclear magnetic resonance signals in accordance with the principles of the present invention.

The further processing of the signals S0 to S3 obtained in this way is schematically shown in FIG. 8. The obtained signals S0 to S3 are sampled and digitized in a fixed time grid in a standard manner. The digitized values are entered corresponding to their phase encoding into rows of separate raw data matrices RD0 to RD3. In the present case, all signals S0 to S3 have the same phase coding, and are thus allocated the same row number of the respective raw data matrix RD0 to RD3.

The pulse sequence shown in FIGS. 2 to 7 is repeated with different phase encodings until all rows of all four raw data matrices RD0 to RD3 are filled with measurement values.

Each of the raw data matrices RD0 to RD3 is subjected in a known way to a two-dimensional Fourier transform. The data obtained from the flow-compensated signals S0 are used as reference data. These are subtracted in subtraction stages D1 to D3 from the flow-coded data sets obtained from signals S1 to S3, in order to suppress stationary tissue in the image representation, or to calculate the phase difference.

Three image data matrices BD1 to BD3 are thus obtained. These image data matrices BD1 to BD3 contain image data with different information content concerning the flow. Low flow velocities are represented in the image matrix BD1, which was obtained in connection with a strong flow coding gradient GRF1; i.e., vessels having this type of flow therein (e.g. peripheral vessels) are thus clearly represented in the matrix BD1. The image data set BD3, on the other hand, was obtained in connection with a weak flow coding gradient GRF3. Thus, vessels with high flow velocities are principally represented herein, these including main arteries, for example.

The image data BD1 to BD3 can be represented separately on a monitor M, and images with strongly differing information content concerning different vessels are thereby obtained. The image data BD1 to BD3, however, can also be superimposed, and an overall image is thus obtained, comprising both vessels with low flow velocities and vessels with high flow velocities.

In the method shown, the flow is acquired only in the direction of the readout gradient GR. The method shown can also be used analogously for the direction of the slice selection gradient GS and for the direction of the phase encoding gradient GP.

In the represented pulse sequence, four measurements are required in order to obtain respectively rows in four raw data matrices RD0 to RD3; to obtain 256 rows, 1024 measurements are thus required, for example. According to the time resolution requirement, a real-time image measurement may thus become impossible. In this case, one can make use of known triggering methods, as explained in more detail in e.g. D. J. Atkinson et al., "Cineangiography of the Heart in a Single Breath Hold with a Segmented TurboFLASH Sequence," in Radiology 1991, 178, pp. 357–360. For this purpose, measurements are triggered, e.g. from an EKG trigger, and after each triggering a part of the corresponding raw data matrices is respectively obtained for different heart phases. Complete raw data matrices are not obtained until after a number of triggerings, which are allocated to different heart cycles, and from which images for different heart cycles can be obtained.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for spatially resolved flow acquisition comprising the steps of:

(a) exciting nuclear magnetic resonance signals in an examination subject having a flow therein by emitting a radio-frequency pulse;

(b) emitting a phase encoding gradient in a first direction;

(c) emitting a bipolar flow encoding gradient having at least two sub-pulses in at least one direction;

(d) reading out said nuclear magnetic resonance signals from said subject under a readout gradient in a second direction perpendicular to said first direction to obtain read out nuclear magnetic resonance signals each having a phase associated therewith which has a sensitivity to said flow;

(e) determining said flow in said subject from the respective phase of the read out nuclear magnetic resonance signals; and (f) repeating steps (a) through (e) n times in successive measurements, with an absolute value of an amplitude-time integral of the sub-pulses of the bipolar flow encoding gradient being different in each measurement with the same phase encoding gradient, thereby obtaining data respectively in said successive measurements having different sensitivity of said phase to said flow.

2. A method as claimed in claim 1 wherein step (f) comprises varying said amplitude of said bipolar flow encoding gradient in successive measurements while maintaining a duration of said bipolar flow encoding gradient constant from measurement to measurement.

3. A method as claimed in claim 1 wherein said data acquired with different flow encoding gradients are used for reconstructing a separate image for each different flow encoding gradient.

4. A method as claimed in claim 1 wherein said data acquired with different flow encoding gradients are used for reconstructing a combined image for said different flow encoding gradients.

5. A method as claimed in claim 1 wherein step (c) comprises emitting said bipolar flow encoding gradient in said second direction, and emitting a flow compensation gradient in at least one direction.

6. A method as claimed in claim 1 wherein step (c) comprises emitting said bipolar flow encoding gradient in different directions in successive measurements.

7. A method as claimed in claim 1 wherein said examination subject has T1 and T2 relaxation times associated with nuclear spins excited in said examination subject for producing said nuclear magnetic resonance signals, and said method comprising conducting steps (a) through (d) with a repetition time which is less than said relaxation times, and resetting the phase encoding of the nuclear spins before each excitation of nuclear magnetic resonance signals in step (a).

8. An apparatus for spatially resolved flow acquisition comprising:

means for exciting nuclear magnetic resonance signals in an examination subject having a flow therein by emitting a radio-frequency pulse;

means for emitting a phase encoding gradient in a first direction;

means for emitting a bipolar flow encoding gradient having at least two sub-pulses in at least one direction;

means for reading out said nuclear magnetic resonance signals from said subject under a readout gradient in a second direction perpendicular to said first direction to obtain read out nuclear magnetic resonance signals each having a phase associated therewith which has a sensitivity to said flow; and means for controlling said means for exciting nuclear magnetic resonance signals, said means for emitting a phase encoding gradient, said means for emitting a bipolar flow encoding gradient and said means for reading out said nuclear magnetic resonance signals for conducting a plurality n of successive measurements with an absolute value of an amplitude-time integral of said sub-pulses of said bipolar flow encoding gradient being different from measurement to measurement, with the same phase encoding gradient, for obtaining data respectively in said successive measurements having different sensitivity of said phase to said flow.

9. An apparatus as claimed in claim 8 wherein said means for emitting said bipolar flow encoding gradient comprise means for emitting a bipolar flow encoding gradient having an amplitude varying in successive measurements with a duration of said bipolar flow encoding gradient being constant from measurement to measurement.

10. An apparatus as claimed in claim 8 further comprising means for generating and displaying image reconstructed from data acquired with different flow encoding gradients.

11. An apparatus as claimed in claim 8 further comprising means for generating and displaying a combined image reconstructed from data acquired with different flow encoding gradients.

12. An apparatus as claimed in claim 8 wherein said means for controlling comprise means for controlling said means for emitting a flow encoding gradient for emitting a flow encoding gradient in said second direction, and said apparatus further comprising means for emitting a flow compensation gradient in at least one direction in each of said successive measurements.

13. An apparatus as claimed in claim 8 wherein said means for controlling comprise means for controlling said means for emitting a flow encoding gradient in a different direction in successive measurements.

14. An apparatus as claimed in claim 8 wherein said subject has relaxation times T1 and T2 of excited nuclear spins associated therewith, said nuclear spins producing said nuclear magnetic resonance signals, and wherein said means for controlling comprise means for conducting each measurement with repetition time which is less than said relaxation times, and said apparatus further comprising means for resetting the phase encoding of the nuclear spins before each new excitation of nuclear magnetic resonance signals.

* * * * *